United States Patent
Menon et al.

(10) Patent No.: US 9,755,023 B2
(45) Date of Patent: Sep. 5, 2017

(54) PHOTOELECTROCHEMICAL CELL INCLUDING GA(SB$_x$)N$_{1-x}$ SEMICONDUCTOR ELECTRODE

(71) Applicants: The University of Kentucky Research Foundation, Lexington, KY (US); The University Of Louisville Research Foundation, Inc., Louisville, KY (US)

(72) Inventors: Madhu Menon, Lexington, KY (US); Michael Sheetz, Lexington, KY (US); Mahendra Kumar Sunkara, Louisville, KY (US); Chandrashekhar Pendyala, Chandler, AZ (US); Swathi Sunkara, Louisville, KY (US); Jacek B. Jasinski, Louisville, KY (US)

(73) Assignees: The University of Kentucky Research Foundation, Lexington, KY (US); The University of Louisville Research Foundation, Inc., Louisville, KY (US)

( * ) Notice: Subject to any disclaimer, the term of this patent is extended or adjusted under 35 U.S.C. 154(b) by 1064 days.

(21) Appl. No.: 13/630,875

(22) Filed: Sep. 28, 2012

(65) Prior Publication Data

US 2013/0081940 A1   Apr. 4, 2013

Related U.S. Application Data

(60) Provisional application No. 61/541,461, filed on Sep. 30, 2011.

(51) Int. Cl.
C25B 1/04 (2006.01)
H01L 29/20 (2006.01)
(Continued)

(52) U.S. Cl.
CPC .......... *H01L 29/2003* (2013.01); *C25B 1/003* (2013.01); *H01L 21/0254* (2013.01);
(Continued)

(58) Field of Classification Search
CPC ................. C25B 1/003; H01L 29/2003; H01L 21/02425; H01L 21/0254; H01L 21/02549;
(Continued)

(56) References Cited

U.S. PATENT DOCUMENTS 4,090,933 A   5/1978 Nozik
4,439,301 A   3/1984 Reichman et al.
(Continued)

FOREIGN PATENT DOCUMENTS

WO   WO 2011058723 A1 *  5/2011  ............... C25B 9/00

OTHER PUBLICATIONS

Pendyala, Chandrashekhar, "Metal organic chemical vapor deposition of InGaN alloys on nanowire substrates." (2011). Electronic Theses and Dissertations. Paper 1111.*
(Continued)

*Primary Examiner* — Ciel Thomas
(74) *Attorney, Agent, or Firm* — King & Schickli, PLLC

(57) ABSTRACT

The composition of matter comprising Ga(Sb$_x$)N$_{1-x}$ where x=0.01 to 0.06 is characterized by a band gap between 2.4 and 1.7 eV. A semiconductor device includes a semiconductor layer of that composition. A photoelectric cell includes that semiconductor device.

23 Claims, 6 Drawing Sheets

(51) Int. Cl.
*H01L 21/02* (2006.01)
*C25B 1/00* (2006.01)

(52) U.S. Cl.
CPC .... *H01L 21/0262* (2013.01); *H01L 21/02425* (2013.01); *H01L 21/02549* (2013.01); *H01L 21/02573* (2013.01); *Y02P 20/135* (2015.11)

(58) Field of Classification Search
CPC .......... H01L 21/02573; H01L 21/0262; Y02P 20/135
See application file for complete search history.

(56) References Cited

U.S. PATENT DOCUMENTS

| | | | |
|---|---|---|---|
| 4,501,804 A | 2/1985 | Bockris et al. | |
| 6,268,618 B1* | 7/2001 | Miki | H01L 33/42 257/103 |
| 6,936,143 B1 | 8/2005 | Graetzel et al. | |
| 7,122,873 B2 | 10/2006 | Miller et al. | |
| 7,271,334 B2 | 9/2007 | Gratzel et al. | |
| 7,601,308 B2 | 10/2009 | Austin | |
| 7,763,149 B2 | 7/2010 | Maggard | |
| 7,820,022 B2 | 10/2010 | McNulty et al. | |
| 2004/0026710 A1* | 2/2004 | Tsuda et al. | 257/103 |
| 2005/0079659 A1* | 4/2005 | Duan et al. | 438/197 |
| 2005/0183962 A1 | 8/2005 | Oakes | |
| 2007/0246370 A1 | 10/2007 | Dimroth | |
| 2008/0131762 A1 | 6/2008 | Joo et al. | |
| 2009/0278233 A1* | 11/2009 | Pinnington et al. | 257/615 |
| 2010/0133111 A1* | 6/2010 | Nocera et al. | 205/633 |
| 2011/0214996 A1 | 9/2011 | Yoshida et al. | |
| 2011/0220515 A1 | 9/2011 | Nakanishi et al. | |
| 2012/0267234 A1* | 10/2012 | Reece et al. | 204/157.5 |
| 2012/0276464 A1* | 11/2012 | Kuroha et al. | 429/418 |

OTHER PUBLICATIONS

A. Belabbes, et al.; "Giant and composition-dependent optical gap bowing in dilute GaSb1-xNx alloys"; Applied Physics Letters 88, 152109; doi: 10.1063/1.2196049; American Institute of Physics (2006); pp. 1-3.

* cited by examiner

PHOTOELECTROCHEMICAL CELL INCLUDING GA(SB$_x$)N$_{1-x}$ SEMICONDUCTOR ELECTRODE

This utility patent application claims the benefit of priority in U.S. Provisional Patent Application Ser. No. 61/541,461 filed on Sep. 30, 2011, the entirety of the disclosure of which is incorporated herein by reference.

This invention was made with government support under contract no. DE-FG02-07ER46375 awarded by U.S. Department of Energy. The government has certain rights in the invention.

TECHNICAL FIELD

This document relates generally to semiconductor devices and photoelectrochemical technology and, more particularly to a photoelectrochemical cell including an antimony substituted gallium nitride semiconductor electrode.

BACKGROUND

Ternary semiconductors are potential candidate for optoelectronic and photoelectrochemical (direct solar water splitting) applications owing to their tunable composition-dependent properties. Solar water splitting requires the material to have a band gap between 1.7 and 2.2 eV and the band edges to straddle H$_2$/O$_2$ redox potentials. Gallium nitride (GaN), a wide, direct-band-gap semiconductor, has been shown to be stable under visible photolysis and has the right band edge energetics. Tandem cells based on III-V materials have been shown to have very high efficiency for spontaneous photoelectrochemical (PEC) water splitting (≈12%), but their applicability as single-gap cells for direct photoelectrochemical water splitting has been limited by the unfavorable band energetics.

The successful development of photocatalysts, which work under visible-light irradiation to efficiently utilize solar energy, has remained elusive. This document relates to antimony substituted gallium nitride composition of matter, an antimony substituted gallium nitride semiconductor electrode and to a photoelectrochemical cell including such an electrode.

SUMMARY

In accordance with the purposes described herein a new composition of matter comprises an antimony substituted gallium nitride with the chemical formula Ga(Sb$_x$)N$_{1-x}$ where x=0.01 to 0.06 characterized by a band gap between 2.4 and 1.7 eV. In another useful embodiment x=from 0.01-0.02. In another useful embodiment x=from 0.02-0.03. In another useful embodiment x=from 0.03-0.04. In yet another useful embodiment x=from 0.04-0.06.

In accordance with an additional aspect, an antimony-substituted gallium nitride semiconductor device comprises a substrate having a first face and a semiconductor layer of Ga(Sb$_x$)N$_{1-x}$ where x=0.01 to 0.06 on the first face of the substrate. This semiconductor layer is characterized by a band gap between 2.4 and 1.7 eV. The semiconductor layer has a thickness of about 100 nm to about 500 nm. The semiconductor layer may include a p-type dopant, an n-type dopant or simply be an "as-synthesized" layer. The semiconductor device may further include an electrocatalyst coating on a face of the semiconductor layer. The electrocatalyst coating may be selected from a group of materials consisting of platinum, RuO$_2$ and mixtures thereof.

The substrate is a conductive substrate. Such a substrate may be a single crystal substrate or comprise a nanowire array on a supporting substrate.

In accordance with yet another aspect a photoelectric cell is provided. The photoelectric cell comprises an electrolyte vessel, an electrolyte held in the vessel, a first semiconductor electrode in contact with the electrolyte and a counter electrode in contact with the electrolyte. The first semiconductor electrode includes a first semiconductor layer of Ga(Sb$_x$)N$_{1-x}$ where x=0.01 to 0.06 having a band gap of between 2.4 and 1.7 eV. At least a portion of the electrolyte vessel allows sunlight to impinge on the semiconductor electrode. In one embodiment the electrolyte is water and the sunlight drives an electrolysis reaction wherein O$_2$ is liberated at the semiconductor electrode and H$_2$ is liberated at the counter electrode.

In one embodiment the counter electrode is made of platinum. In another embodiment the counter electrode is a second semiconductor electrode including a second semiconductor layer of Ga(Sb$_x$)N$_{1-x}$ where x=0.01 to 0.06 having a band gap of between 2.4 and 1.7 eV. Further the second semiconductor layer includes a p-type dopant.

In accordance with yet another aspect a method is provided for producing Ga(Sb$_x$)N$_{1-x}$ where x=0.01 to 0.06 characterized by a band gap of 2.4 to 1.7 eV. The method comprises delivering a source of nitrogen, a source of gallium and a source of antimony to a chemical vapor deposition reactor and depositing a layer of Ga(Sb$_x$)N$_{1-x}$ where x=0.01 to 0.06 onto a substrate. In one embodiment the method includes using ammonia as the source of nitrogen and completing the deposition at a temperature of between 550° C. to 700° C. In another embodiment the method includes using dimethylhydrazine as the source of nitrogen and completing the deposition at a temperature of between 500° C. to 700° C. In yet another embodiment the method includes using trimethylhydrazine as the source of nitrogen and completing the deposition at a temperature of between 500° C. to 700° C. Still further the method may include adding a dopant to the chemical vapor deposition reactor with the sources of nitrogen, gallium and antimony.

BRIEF DESCRIPTION OF THE DRAWINGS

The accompanying drawings incorporated herein and forming a part of the specification, illustrate several aspects of the electrodes and photoelectrochemical cells and together with the description serve to explain certain principles thereof. In the drawings.

Reference will now be made in detail to the present preferred embodiments, examples of which are illustrated in the accompanying drawings.

DETAILED DESCRIPTION

Light absorption by a direct band-gap semiconductor results in the creation of hole ($h^+$) and electron ($e^-$) pairs. At a semiconductor-electrolyte interface, the charges can either be separated to directly generate current or can cause chemical reactions, depending on the system. The minimum energy required at nominal current densities of 10-20 mA/cm$^2$ for water splitting is 1.5-1.6 eV, via the following redox reactions:

| At a p-type electrode: | At an n-type electrode: |
|---|---|
| $2H_2O + 2e^- = 2OH^- + H_2$ | $H_2O + 2h^+ = 2H^+ + \frac{1}{2}O_2$ |

In order to maximize the solar radiation absorption at visible wavelengths, the band-gap of the semiconductor material should be ~2 eV and the material should not decompose or degrade as a result of photolysis. Improved photo-electrode materials must exhibit (a) better visible light absorption (b) appropriate band-edge energetics with respect to water splitting; (c) fast electrochemical reactions to reduce surface charge build-up; (d) low bulk and surface recombination from trap and defect states; and (e) fast charge transport.

A composition of matter suitable for this purpose comprises $Ga(Sb_x)N_{1-x}$ where x=0.01 to 0.06. This composition is characterized by a band gap of between 2.4 and 1.7 eV. In one useful embodiment the composition of matter comprises $Ga(Sb_x)N_{1-x}$ where x=0.01-0.02. In another useful embodiment the composition of matter comprises $Ga(Sb_x)N_{1-x}$ where x=0.02-0.03. In another useful embodiment the composition of matter comprises $Ga(Sb_x)N_{1-x}$ where x=0.003-0.04. In yet another useful embodiment the composition of matter comprises $Ga(Sb_x)N_{1-x}$ where x=0.04-0.06.

Figure 5:
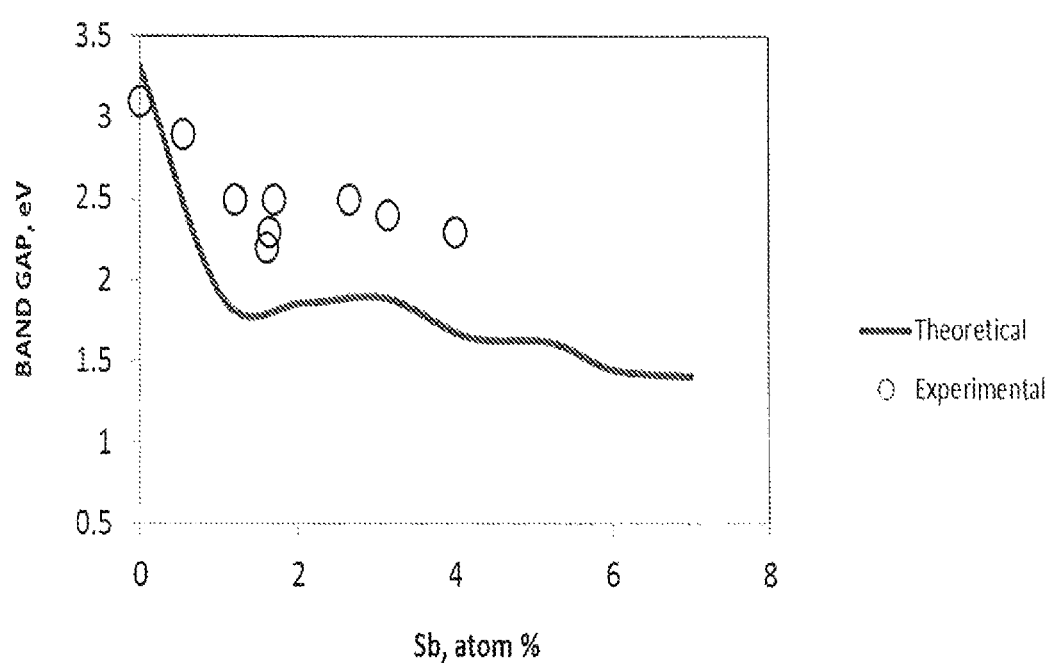
FIG. 5 graphically illustrates experimental and theoretical energy band gap data for antimony substituted gallium nitride as a function of antimony concentration.
Figure 6:
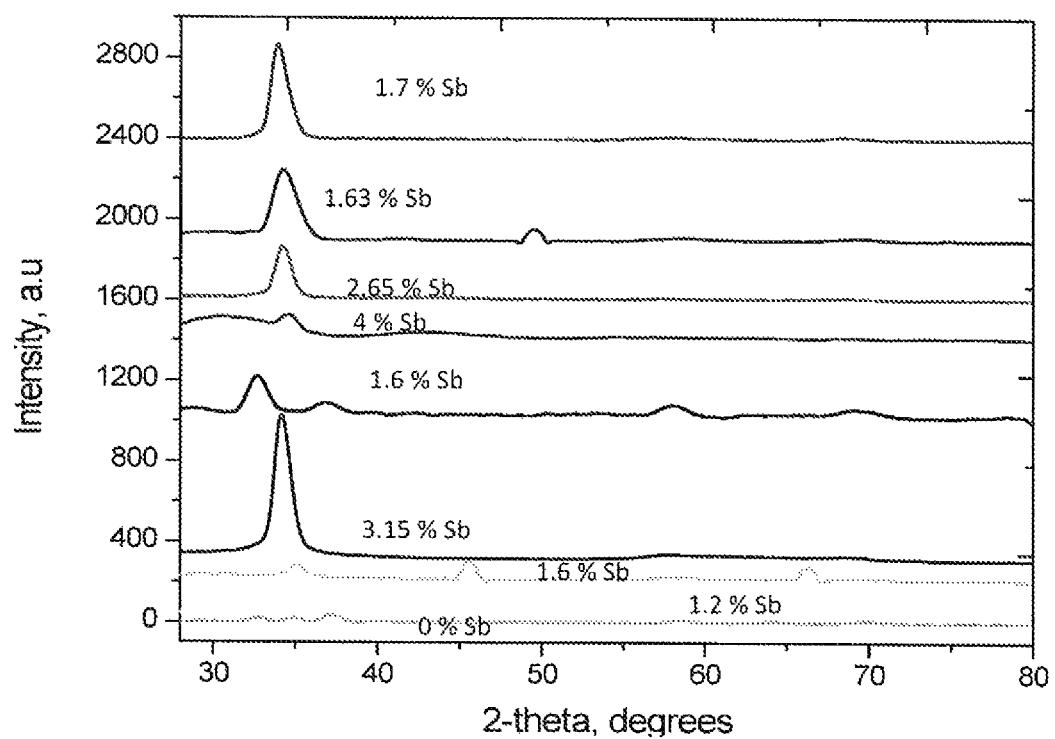
FIG. 6 graphically illustrates XRD patterns for antimony substituted gallium nitride layers with various antimony concentrations.

Significantly, dilute alloying of gallium nitride with antimony reduces the band gap of the composition with increasing antimony incorporation. The band gap of the gallium nitride is reduced to the visible region, with the incorporation of low amounts of antimony. For example, incorporation of antimony at 2% lowered the band gap from 3.4 eV to 2 eV. As illustrated in the following examples the dilute alloys of antimony and substituted gallium nitride are synthesized using metal organic chemical vapor deposition at temperatures much lower than that required to synthesize gallium nitride. Experimental data also shows that the lattice parameter increases monotonically with antimony incorporation. Experimental and theoretically band gap data for antimony substituted gallium nitride is found in FIG. 5. XRD patterns for antimony substitute gallium nitride layers with various antimony concentrations are graphically set forth in FIG. 6.

Figure 1A:
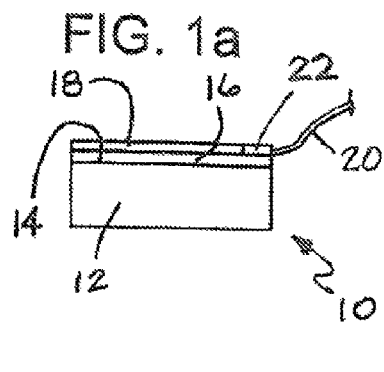
FIG. 1a is a schematical end elevational view illustrating a first embodiment of a semiconductor electrode.

FIG. 1a schematically illustrates a semiconductor device 10 including a single crystal substrate 12 having a first face 14. Such a single crystal substrate 12 may be made from a material including, but not limited to, silicone, GaN grown silicon, GaN covered sapphire substrate, silicon carbide and sapphire. A semiconductor layer of $Ga(Sb_x)N_{1-x}$ where x=0.01 to 0.06 is provided on the face 14. The semiconductor layer 16 is characterized by a band gap of between 2.4 and 1.7 eV. The semiconductor layer 16 has a thickness of about 100 nm to about 500 nm. The semiconductor layer 16 may include an n-type dopant. The n-type dopant may be provided as synthesized or added. Representative n-type dopants include but are not limited to silicon. Alternatively the semiconductor layer 16 may include a p-type dopant. Representative p-type dopants include but are not limited to magnesium.

As further illustrated in FIG. 1a, the semiconductor device 10 may further include an optional electrocatalyst coating 18 that covers the semiconductor layer 16. The electrocatalyst coating 18 is selected from a group of materials consisting of platinum, $RuO_2$ and mixtures thereof. The semiconductor device 10 may further include a wire lead 20 connected directly to the substrate 12 by means of an appropriate epoxy 22.

Figure 1B:
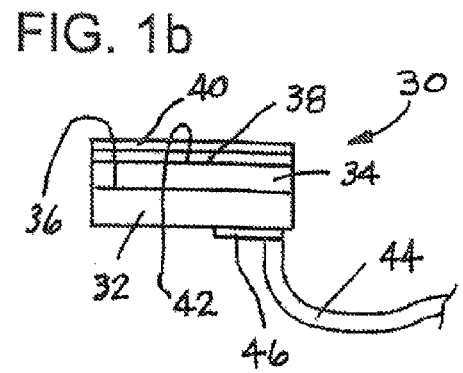
FIG. 1b is a schematical end elevational view illustrating a second embodiment of a semiconductor electrode.

An alternative embodiment of semiconductor device 30 is illustrated in FIG. 1b. The semiconductor device 30 includes a conductor substrate 32 made of, for example stainless steel or fluorine doped tin oxide (FTO) covered glass. A nanowire array 34 made from a material selected from a group consisting of silicon, GaN, InN and mixtures thereof is grown on the face 36 of the support substrate 32 in a manner well known in the art. A semiconductor layer of $Ga(Sb_x)N_{1-x}$ where x=0.01 to 0.06 is grown on the face 42 of the nanowire array covered substrate 32. The semiconductor layer 38 is the same as the semiconductor layer 16 of the embodiment illustrated in FIG. 1a described above. The semiconductor device 30 may further include an optional electrocatalyst coating 40 on the face of the semiconductor layer 38. The electrocatalyst coating 40 may be identical to the electrocatalyst coating 18 described above with respect to the FIG. 1a embodiment. In addition, the device 30 may include a lead wire 44 connected by a contact 46 to the substrate 32.

Figure 2:
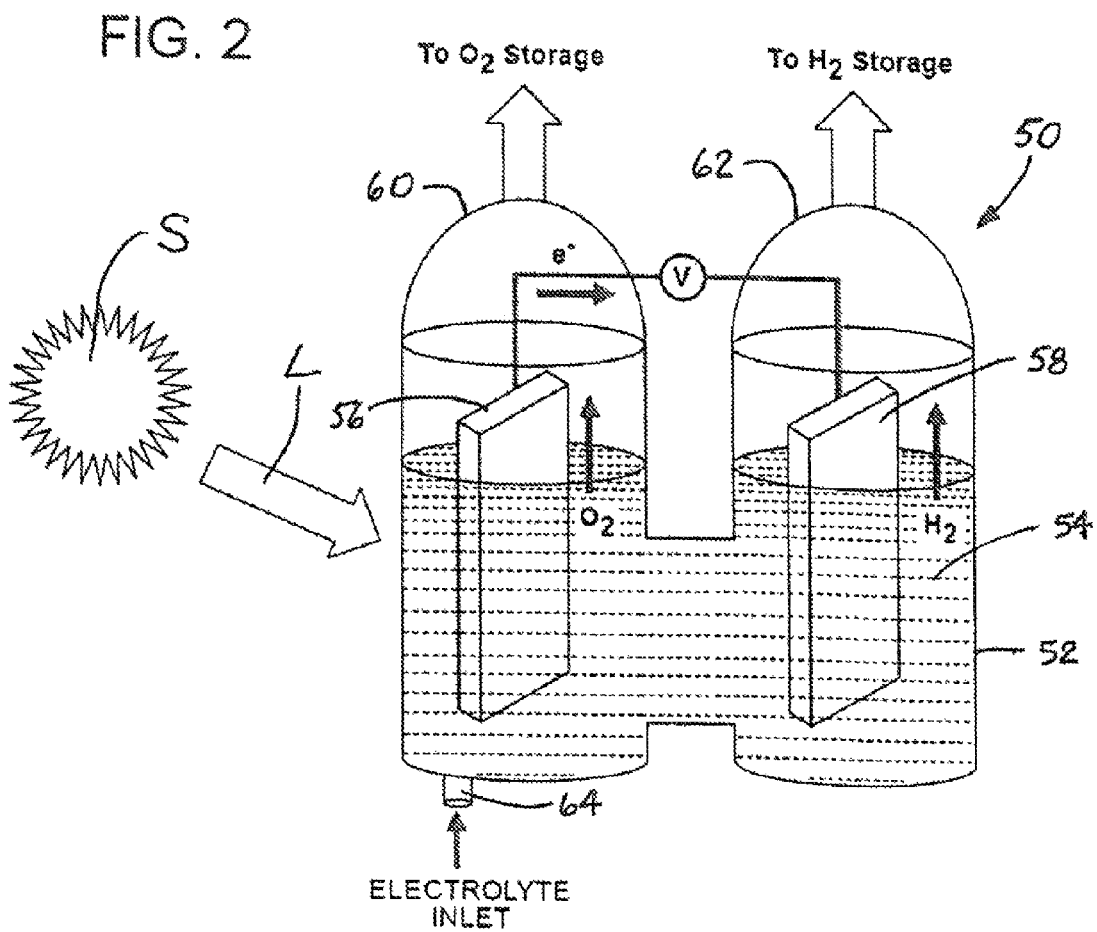
FIG. 2 is a schematical representation of a photoelectrochemical cell.
Figure 3A:
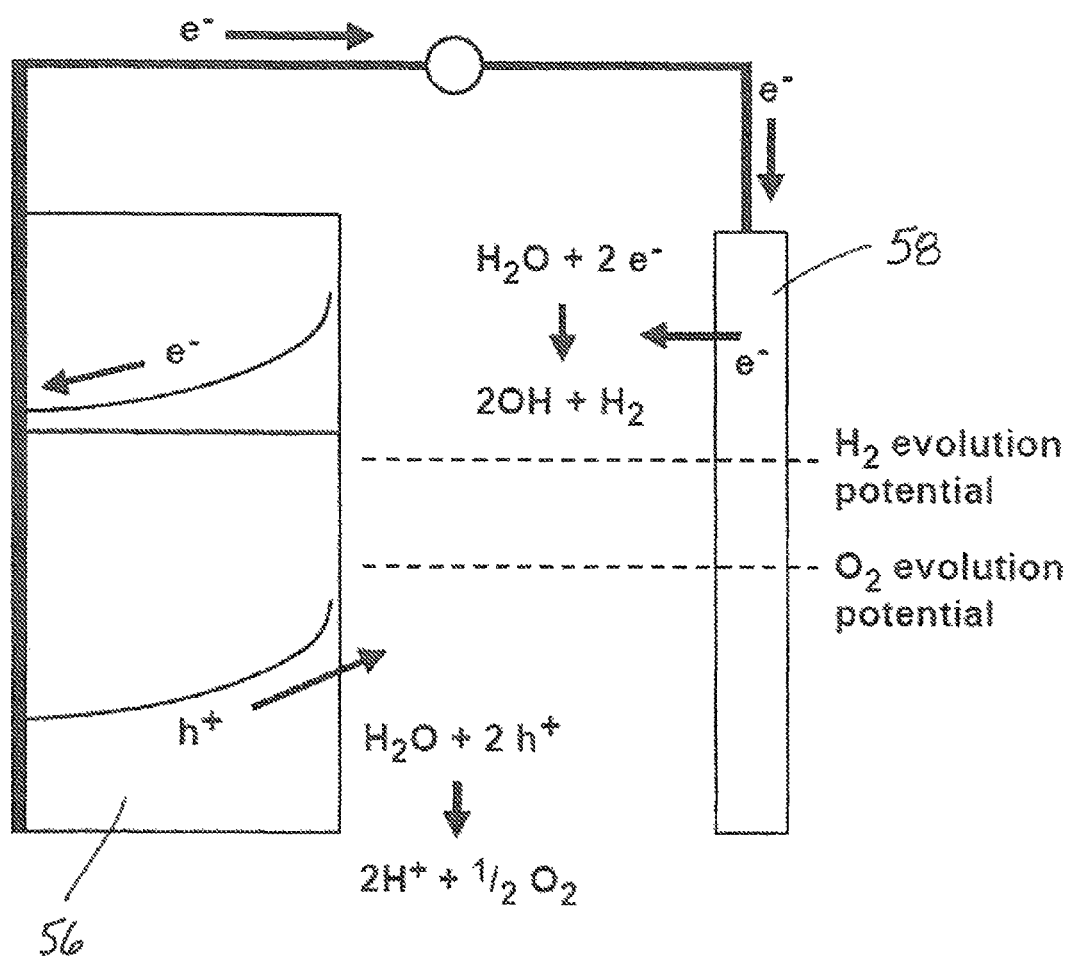
FIG. 3a is a schematical illustration of a first electrode embodiment for the cell of FIG. 2. As illustrated, the band edges straddle the hydrogen and oxygen evolution potentials. More specifically, the conductive band is negative (higher) and the valence band is positive (lower) then the hydrogen and oxygen potentials respectively. The amount of straddle is the available driving force for the charge carriers to drive the respective reactions.
Figure 3B:
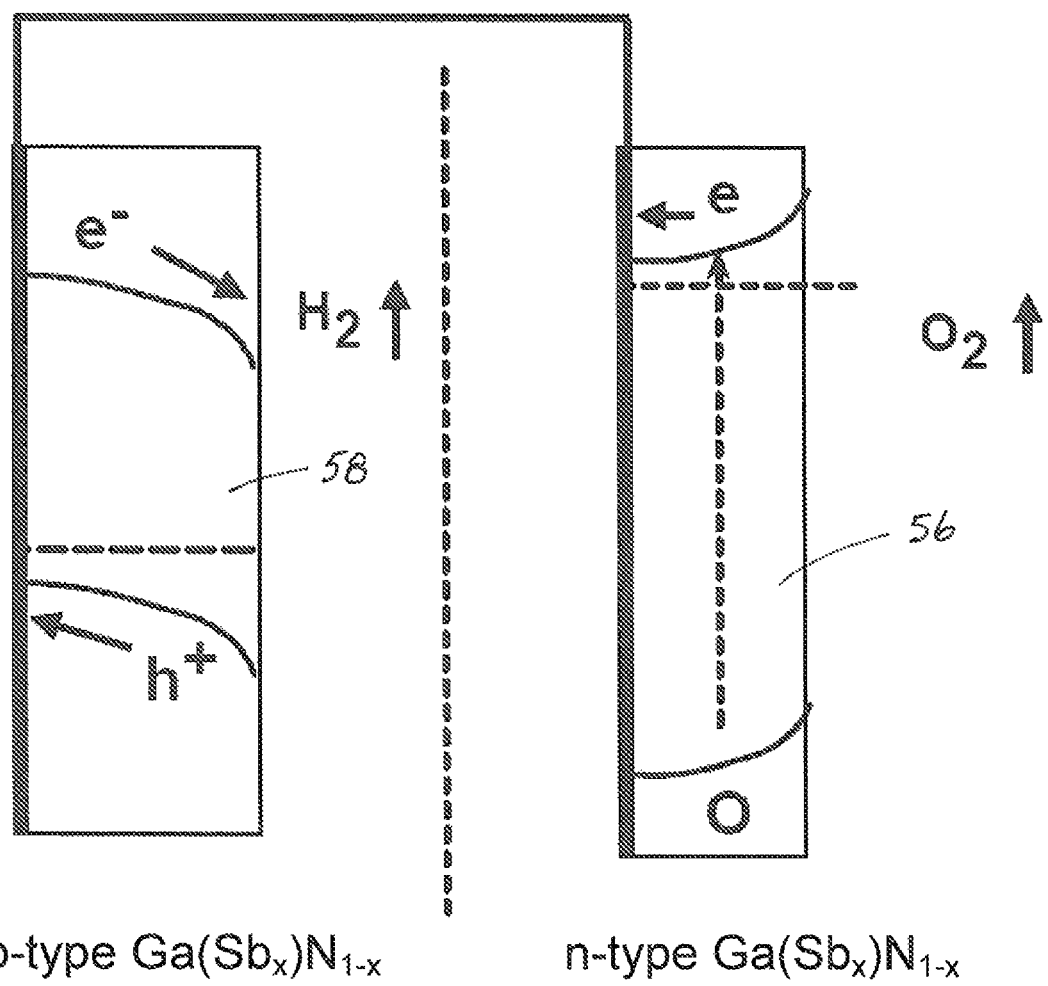
FIG. 3b is a schematical illustration of a second electrode embodiment for the cell of FIG. 2.

Semiconductor devices 18, 30 including n-type and p-type dopant semiconductor layers 16, 38 may be used, respectively, as anodes and cathodes in photoelectrochemical cells of the type illustrated in FIG. 2. Such a photoelectrochemical cell 50 comprises an electrolyte vessel 52 which holds an electrolyte 54. A first semiconductor electrode 56 is provided in a first portion of the electrolyte vessel 52 while a counter electrode 58 is provided in the second portion of the vessel. As should be appreciated, both the first semiconductor electrode 56 and the counter electrode 58 are in contact with the electrolyte 54 inside the vessel 52. In the embodiment illustrated in FIG. 2, the first semiconductor electrode 56 corresponds to either of the semiconductor devices 18, 30 where that device incorporates a semiconductor layer of $Ga(Sb_x)N_{1-x}$ where x=0.01 to 0.06 and includes an n-type dopant. As illustrated in FIG. 3a, in one possible embodiment the counter electrode 58 is made from platinum or other appropriate material. As illustrated in FIG. 3b, in another possible embodiment, the counter electrode 58 is a second semiconductor electrode corresponding to either of the semiconductor devices 18, 30 described above and incorporating a p-type dopant.

As should further be appreciated from viewing FIG. 2, at least a portion of the electrolyte vessel 52 allows light L from the sun S to impinge upon the semiconductor electrode 56 or both electrodes 56, 58 where both are semiconductor electrodes. Thus, for example, the vessel 52 may be made from quartz or include an appropriate quartz window for the best light transmission. Upon illumination, electron hole pairs are generated in the semiconductor layer 16, 38 of the electrode 56. The majority charge carriers are driven to the counter electrode 58 and the minority carriers drive the reaction on the semiconductor surface 56. Since the semiconductor layer 16, 38 has a direct band gap of between 2.4 and 1.7 eV, and the band edges straddle the $H_2$ and $O_2$ evolution reactions, spontaneous electrolysis occurs and $O_2$ is evolved at the electrode 56 while $H_2$ is evolved at the electrode 58 (see also FIGS. 3a and 3b). The $O_2$ is collected from the dome 60 and stored for subsequent use while the $H_2$ is collected from the dome 62 and stored for subsequent use. As electrolysis proceeds, the electrolyte 54 is consumed. The electrolyte 54 may be replenished from a reservoir (not shown) through the electrolyte inlet 64.

The antimony substituted gallium nitride composition of matter used in the semiconductor layers 16, 38 may be produced by means of a relatively simple method comprising the steps of delivering a source of nitrogen, a source of gallium and a source of antimony to a chemical vapor deposition reactor and depositing a layer of $Ga(Sb_x)N_{1-x}$ where x=0.01 to 0.06 onto a suitable conducting substrate. In one embodiment the method includes using ammonia as a source of nitrogen and completing the deposition at a temperature of between 550° C. to 700° C. In one embodiment the method includes using dimethylhydrazine as the source of nitrogen and completing the deposition at a temperature of between 500° C. to 700° C. In yet another embodiment the method includes using trimethylhydrazine as the source of nitrogen and completing the deposition at a temperature of between 500° C. and 700° C. Further the method may include adding a dopant to the chemical vapor deposition reactor with the sources of nitrogen, gallium and antimony. The dopant may be an n-type dopant or a p-type dopant as desired.

The following synthesis and examples are presented to further illustrate the method of making the antimony substituted gallium nitride composition of matter and a semiconductor device incorporating a semiconductor layer of that composition of matter. Experiments were performed using a metal organic chemical vapor deposition (MOCVD) reactor (see FIG. 4). That MOCVD reactor 100 may be generally described as including a reactor housing 102 enclosing a reactor chamber 104. A water cooled jacket 106 is provided around the housing 102 to allow for cooling of the housing. A precursor distribution system 108 feeds sources of gallium, antimony and additives and/or dopants such as magnesium to a shower head distribution element 110 at the top of the chamber 104. A separate carrier gas source inlet 112 brings a source of carrier gas (e.g. nitrogen) to the shower head. The shower head 110 directs the precursors toward a substrate 114 that is held on a SiC coated graphite susceptor 116. The susceptor 116 is heated using a resistive heater 118. A port 120 is connected to a vacuum pump (not shown) to maintain a desired pressure in the chamber 104 for the vapor deposition process.

Figure 4:
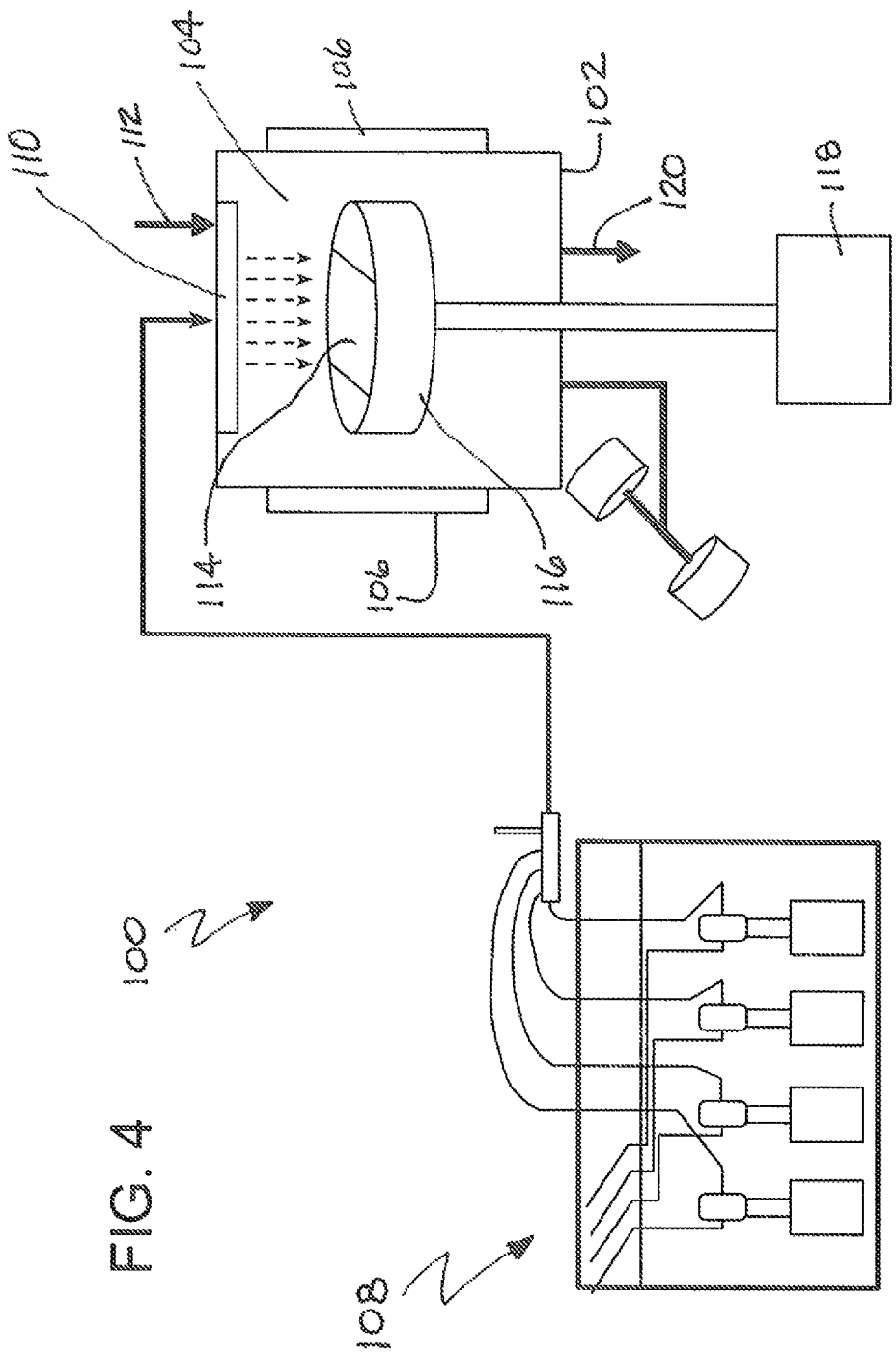
FIG. 4 is a schematical illustration of the metal organic chemical vapor deposition reactor used to make the antimony substituted gallium nitride material used in certain of the electrodes.

The following examples 1 and 2 describe in detail methods of preparing the antimony substituted gallium nitride composition of matter using the MOCVD reactor illustrated in FIG. 4. Examples 3 and 4 illustrate production of a semiconductor device utilizing that composition of matter.

EXAMPLE 1

$Ga(Sb_x)N_{1-x}$ layers were synthesized in a MOCVD reactor of the type illustrated in FIG. 4. Substrates of Quartz, Sapphire coated with GaN, silicon and stainless steel were prepared by cleaning with HCl solution and thoroughly rinsing with ethanol. The chamber pressure was maintained at 80 torr and the substrate temperature was maintained at 615° C. for 30 minutes. The resulting film showed 2% antimony incorporation. We performed several experiments by changing the temperature from 550 to 650° C. to obtain variation in antimony incorporation. The heating source was an Inconel 600 substrate heater coated with Aluminum Nitride (AlN). The substrates were directly placed on the heater or susceptor in the reaction chamber and a K-type thermocouple was integrated with the substrate heater to measure the temperature. The feedstock gases were trimethyl gallium (TMGa) and trimethyl antimony (TMSb), with nitrogen as the carrier gas. Nitrogen was passed through precursor bubblers and was uniformly dispensed through the shower head of the reactor chamber along with ammonia (11 pm). The substrate was placed at a distance of 2 inches from the shower head and the flux of the TMGa and TMSb precursors was maintained at 0.4 μmol/min and 0.2 μmol/min respectively. The TMGa and TMSb bubblers were maintained at −10° C. to reach the desired vapor pressure.

EXAMPLE 2

Dilute alloying of gallium nitride (GaN) with antimony is obtained using the above method by using trimethyl hydrazine as nitrogen source instead of ammonia. It is also possible for using dimethylhydrazine as another nitrogen precursor. Experiment using this precursor allowed crystalline quality at lower temperatures. The conditions such as substrate temperature and flow rates are similar to that in Example 1.

EXAMPLE 3

Firstly, GaSbxN1−x layer was deposited either directly or on top of other nanowire arrays such as silicon, Indium Nitride or Gallium Nitride on a conducting substrate. The electrode was prepared as follows: the backside of the sample was attached copper coil using a conducting silver epoxy and the long end of copper wire was shielded from contact with electrolyte by keeping it inside a glass tube. All areas of the electrode except the GaSbxN1−x layer were covered with two layers of insulating epoxy: Hysol 9462 and Hysol E120-HP. In this configuration, the photogenerated carriers will diffuse to back contact vertically through the film.

EXAMPLE 4

In this example, a single crystal layer of GaSbxN1−x was deposited on a single crystal substrate. The contact is made on top of the film using conducting silver epoxy and copper coiled rod. The long end of the coil, the contact, the edges and the backside were all protected with two layers of insulating epoxy (Hysol 9462 and Hysol E120-HP). In this configuration, the photogenerated carriers will have to diffuse laterally to contact.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. A photoelectric cell, comprising:
an electrolyte vessel;
an electrolyte held in said vessel;
a first semiconductor electrode in contact with said electrolyte, said first semiconductor electrode including a substrate with a first face and a first semiconductor layer of $Ga(Sb_x)N_{1-x}$ where $x=0.01$ to $0.06$ having a band gap between 2.4 and 1.7 eV in contact with the first face of the substrate; and
a counter electrode in contact with said electrolyte.

2. The cell of claim 1 wherein at least a portion of said electrolyte vessel allows sunlight to impinge on said semiconductor electrode.

3. The cell of claim 1 wherein said electrolyte is water and sunlight drives an electrolysis reaction wherein $O_2$ is liberated at said semiconductor electrode and $H_2$ is liberated at said counter electrode.

4. The cell of claim 2, wherein said counter electrode is made from platinum.

5. The cell of claim 2, wherein said counter electrode is a second semiconductor electrode including a second semiconductor layer of $Ga(Sb_x)N_{1-x}$ where $x=0.01$ to $0.06$ having a band gap between 2.4 and 1.7 eV wherein said second semiconductor layer includes a p-type dopant.

6. The cell of claim 1, where $x=$from $0.01$ – $0.02$.

7. The cell of claim 1, where $x=$from $0.02$ – $0.03$.

8. The cell of claim 1, where $x=$from $0.03$ – $0.04$.

9. The cell of claim 1, where $x=$from $0.04$ – $0.06$.

10. The cell of claim 1, wherein the first semiconductor layer has a thickness of about 100 nm to about 500 nm.

11. The cell of claim 1, wherein the first semiconductor layer includes a p-type dopant.

12. The cell of claim 11, wherein said p-type dopant is magnesium.

13. The cell of claim 11, wherein the first semiconductor layer includes a n-type dopant.

14. The cell of claim 1, further including an electrocatalyst coating on a face of the first semiconductor layer.

15. The cell of claim 14, wherein said electrocatalyst coating is selected from a group of materials consisting of platinum, $RuO_2$ and mixtures thereof.

16. The cell of claim 1, wherein the substrate is a conductive substrate.

17. The cell of claim 16, wherein said conductive substrate is a nanowire array made from a material selected from a group consisting of silicon, GaN, InN and mixtures thereof supported on a support substrate.

18. The cell of claim 17, wherein said support substrate is made from a material selected from a group consisting of stainless steel and FTO covered glass.

19. The cell of claim 1, wherein said substrate is a single crystal substrate.

20. The cell of claim 18, wherein said single crystal substrate is made from a material selected from a group consisting of silicone, GaN grown silicon, GaN covered sapphire substrate, silicon carbide, sapphire.

21. The cell of claim 1, further comprising a wire connected to the substrate.

22. The cell of claim 21, wherein the wire is a nanowire array.

23. A photoelectric cell, comprising:
an electrolyte vessel;
an electrolyte held in said vessel;
a first semiconductor electrode in contact with said electrolyte, said first semiconductor electrode consisting essentially of a substrate with a first face and a first semiconductor layer of $Ga(Sb_x)N_{1-x}$ where $x=0.01$ to $0.06$ having a band gap between 2.4 and 1.7 eV in contact with the first face of the substrate; and
a counter electrode in contact with said electrolyte.

* * * * *